(12) United States Patent
Liu et al.

(10) Patent No.: US 8,587,971 B2
(45) Date of Patent: Nov. 19, 2013

(54) ELECTRONIC CURRENT TRANSFORMER BASED ON COMPLETE SELF-EXCITATION POWER SUPPLY

(75) Inventors: Zhongzhan Liu, Xi'an (CN); Xun Wu, Xi'an (CN); Yanting Song, Xi'an (CN)

(73) Assignee: Xi'an Hwell Optic-Electric Tech Co., Ltd, Xi'an, Shaanxi (CN)

( * ) Notice: Subject to any disclaimer, the term of this patent is extended or adjusted under 35 U.S.C. 154(b) by 143 days.

(21) Appl. No.: 13/391,822

(22) PCT Filed: Jan. 13, 2010

(86) PCT No.: PCT/CN2010/000061
§ 371 (c)(1),
(2), (4) Date: Feb. 23, 2012

(87) PCT Pub. No.: WO2011/085517
PCT Pub. Date: Jul. 21, 2011

(65) Prior Publication Data
US 2012/0153931 A1    Jun. 21, 2012

(51) Int. Cl.
*H02M 1/12* (2006.01)
(52) U.S. Cl.
USPC .......... 363/44; 363/45; 363/46; 363/47; 363/84; 363/86; 363/123; 363/127
(58) Field of Classification Search
USPC .......... 363/44, 45, 46, 47, 84, 86, 123, 127
See application file for complete search history.

(56) References Cited

U.S. PATENT DOCUMENTS

| | | | |
|---|---|---|---|
| 3,921,069 A * | 11/1975 | Milkovic | 324/107 |
| 8,001,396 B2 * | 8/2011 | Inukai et al. | 713/300 |
| 2003/0142514 A1 * | 7/2003 | Hosotani et al. | 363/21.02 |
| 2004/0190311 A1 * | 9/2004 | Sakai | 363/18 |
| 2004/0196671 A1 * | 10/2004 | Yasumura | 363/19 |
| 2006/0062024 A1 * | 3/2006 | Hosotani et al. | 363/16 |
| 2008/0088178 A1 * | 4/2008 | Po | 307/17 |
| 2008/0192517 A1 * | 8/2008 | Lin et al. | 363/52 |
| 2009/0027924 A1 * | 1/2009 | Inukai et al. | 363/21.09 |

* cited by examiner

*Primary Examiner* — Bao Q Vu
(74) *Attorney, Agent, or Firm* — Eagle IP Limited; Jacquleline C. Lui

(57) ABSTRACT

An electronic current transformer (ECT) based on complete self-excitation power supply is provided. The ECT includes an energy-obtaining coil, a rapid voltage-stabilizing circuit and an Analog/Digital (A/D) converting circuit. The output of the energy-obtaining coil is connected with the input of the voltage-stabilizing circuit. The output of the voltage-stabilizing circuit is connected with the control end of the A/D converting circuit. The ECT uses two branch circuits to obtain energy directly from the magnetic field of a bus bar to be measured respectively, synthesizes two output waveforms to fill the wave trough of each other, and reduces the pulse of direct current. In this way, the trough voltage of the synthesized wave is higher than the required stabilizing value of direct voltage and it directly meets the input requirement of the stabilizing module of the voltage-stabilizing circuit. As a result, the ECT can activate the A/D converting circuit rapidly. The present invention has solved the delay problem caused by using a single coil to obtain energy, and has characteristics of small wake-up current, rapid activation and wide application. The ECT can omit additional laser power supply device, simplify the architecture, improve the reliability of operation and service life, and reduce the cost.

9 Claims, 2 Drawing Sheets

ELECTRONIC CURRENT TRANSFORMER BASED ON COMPLETE SELF-EXCITATION POWER SUPPLY

TECHNICAL FIELD

The present invention relates to electric power measurement fields, and more particularly to an electronic current transformer.

BACKGROUND ART

In recent years, the oil-gas insulation system has been replaced by optical isolation technologies in high voltage and extra-high voltage electronic current transformers, so that the insulation technology of new type transformer has achieved a substantial development. The key for implementing such technology development is that, there are optical fiber communications between the high voltage side and low voltage side, and a power supply for a digital circuit is required to be set at the high voltage side, so as to digitize the magnitude of current; this is the biggest technical problem confronted during the manufacturing of the electronic transformer. At present, the method of transporting laser energy from the low voltage side to the high voltage side via the optic cable is generally adopted by domestic and foreign researchers and developers. The disadvantages for such method include: ① the life period of the laser source is short with about only 8000-10000 hours; ② the cost is expensive at about 12,000¥, which is more than half of the cost of a whole 110 kv transformer; ③ the environmental condition required by the laser is strict, as a result, it is difficult to conduct the on-site operation and maintenance. Therefore, researchers hope to obtain energy serving as the high voltage side power supply directly from the magnetic field of high voltage bus bar which is to be measured, via electromagnetic induction. There are already some domestic patents and technical literatures in the field of energy supply depending on the self-excitation power supply, for example, a paper titled "research for the energy supplying method of self-excitation power supply at the high voltage side of the electronic current transformer" was published in High-voltage Electrical, 2006, Issue 1, and a patent titled "a self-excitation power supply apparatus obtaining energy from the power line magnetic field (ZL2005100430602)". At that time, the wake-up current is reduced to less than 800 mA with the use of the technical measure, but the problem of wake-up time for the transformer has not resolved completely yet. The startup time is postponed for more than 50 mS since the output voltage of the energy-obtaining coil is required to be rectified and filtered after each switching on. To overcome this shortcoming and reduce the startup time, an external laser power supply is still required at the startup time (i.e. the time of each switching on) of the transformer, which is a big disadvantage and hampers the usage of transformer.

CONTENTS OF THE INVENTION

The objective of the present invention is to overcome the shortcoming in the existing self-excitation power supply technology, and to provide an electronic current transformer based on complete self-excitation power supply without the need for an external power supply at any time, which may replace the laser or other types of external energy supplying products.

To achieve the above objectives, the technical solution is as adopted as follows.

An electronic current transformer (ECT) based on complete self-excitation power supply includes: an energy-obtaining coil, a rapid voltage-stabilizing circuit and an Analog/Digital (A/D) converting circuit. The output of the energy-obtaining coil is connected with the input of the voltage-stabilizing circuit. The output of the voltage-stabilizing circuit is served as the working power supply of the A/D converting circuit; wherein, the energy-obtaining coil group is composed of two energy-obtaining branches, and the phase of the output wave of one energy-obtaining branch leads the phase of the output wave of the other energy-obtaining branch by 60-90°. The output waves of the two energy-obtaining branches are synthesized as the input for the voltage-stabilizing circuit for filtering and energy storing by second-order nonlinear filtering technology in the condition where the input voltage is higher than the stable value, so as to rapidly obtain the voltage-stabilizing output.

The electronic current transformer (ECT) based on complete self-excitation power supply provided by the present invention uses two branch circuits to obtain energy directly and respectively from the magnetic field of the bus bar which is to be measured, synthesizes the two output waveforms to fill the wave trough of each other, so as to reduce the pulse of direct current. In this way, the value of the trough voltage of the synthesized wave is higher than the required stabilizing value of direct voltage and it directly meets the input requirement of the stabilizing module of the voltage-stabilizing circuit. The nonlinear filtering and energy storing circuit overcomes the shortcoming of slow voltage rise in the general linear filter. As a result, it is possible to activate the A/D converting circuit rapidly. The present invention has solved the problem of delay caused by using a single coil to obtain energy and using general linear filtering, and has characteristics of small wake-up current, rapid activation and wide application. It is possible to omit additional laser power supply device, simplify the architecture of the active electronic current transformer, improve the reliability of operation and service life, and reduce the cost.

SPECIFIC MODE FOR CARRYING OUT THE INVENTION

A detailed description of the present invention is provided hereinafter with reference to the attached drawings and embodiments.

Figure 1:
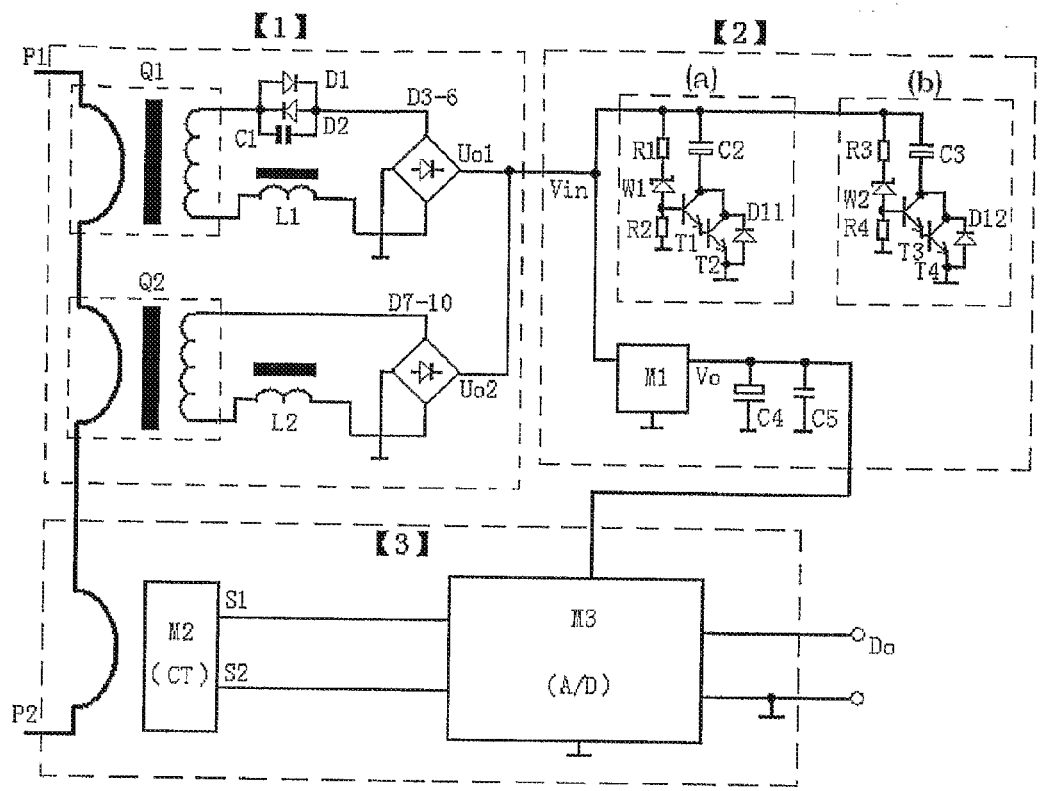
FIG. 1 is a circuit schematic diagram of an electronic current transformer based on complete self-excitation power supply in accordance with an embodiment of the present invention.

As shown in FIG. 1, the electronic current transformer based on complete self-excitation power supply provided in this embodiment includes: an energy-obtaining coil 1, a voltage-stabilizing circuit 2 and an A/D converting circuit 3. The output of the energy-obtaining coil 1 is connected with the input of the voltage-stabilizing circuit 2. The output of the voltage-stabilizing circuit 2 is connected with the control end of the A/D converting circuit 3. The detailed steps are as follows.

The energy-obtaining coil 1 includes a first energy-obtaining branch and a second energy-obtaining branch; the first energy-obtaining branch includes an energy-obtaining coil Q1, a choke coil L1, a diode D1, a diode D2, a capacitor C1, and bridge rectification circuits D3-6; the energy-obtaining coil Q1 obtains energy from a power line alternating magnetic field; the bridge rectification circuits D3-6 rectify and output the energy obtained by the energy-obtaining coil Q1 from the alternating magnetic field of a power line; the capacitor C1 is connected to the secondary circuit of the energy-obtaining coil Q1 in series; the diode D1 and the diode D2 are set in reverse to each other, and both are connected to the capacitor C1 in parallel; the choke coil L1 is connected to the output end of the energy-obtaining coil Q1 in series, in front of the bridge rectification circuits D3-6. The second energy-obtaining branch includes an energy-obtaining coil Q2, a choke coil L2, and bridge rectification circuits D7-10, the energy-obtaining coil Q2 obtains energy from a power line alternating magnetic field; the bridge rectification circuits D7-10 rectify and output the energy obtained by the energy-obtaining coil Q2 from the alternating magnetic field of a power line; the choke coil L2 is connected to the output end of the energy-obtaining coil Q2 in series, in front of the bridge rectification circuits D7-10.

The energy-obtaining coils Q1 and Q2 both adopt iron-based microcrystalline magnetic core rings, and more particularly an energy-obtaining coil of which the inside diameter is 60 mm, the outside diameter is 80 mm and the thickness is 20 mm, made by winding Φ0.5 mm enameled wire uniformly around a magnetic core ring for 70 turns; a power line is arranged to pass through the ring center during installation; if multi-turns of the enameled wires are passed through back and forth, the energy-obtaining effect is proportional to the number of turns passing through the ring center. The choke coils L1 and L2 each adopt a common cold rolling silicon-steel sheet with a circling as the iron core, and more particularly an energy-obtaining coil of which the inside diameter is 32 mm, the outside diameter is 55 mm and the thickness is 20 mm, made by winding Φ0.5 mm enameled wire around a magnetic core ring for 100 turns. The capacitor C1 adopts a capacitor of 20 uf/50V.

Figure 2:
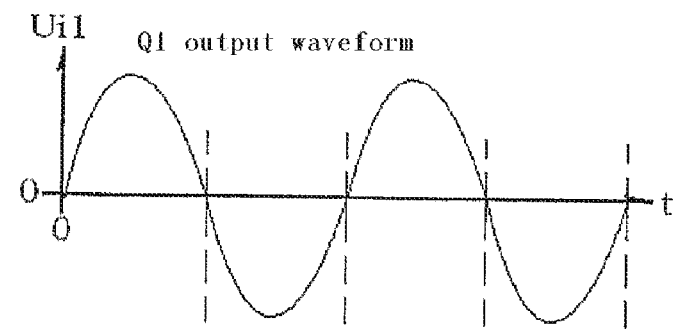
FIG. 2 is a schematic diagram illustrating the output waveform of the energy-obtaining coil Q1 and the output waveform after split-phase rectification thereof.
Figure 2:
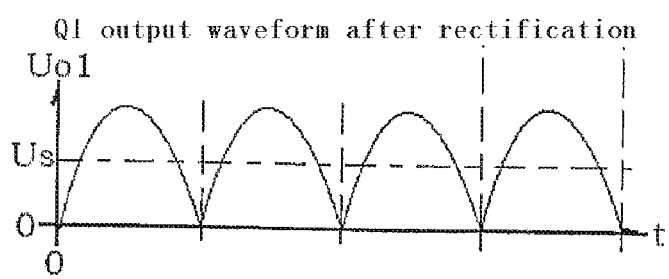
Figure 3:
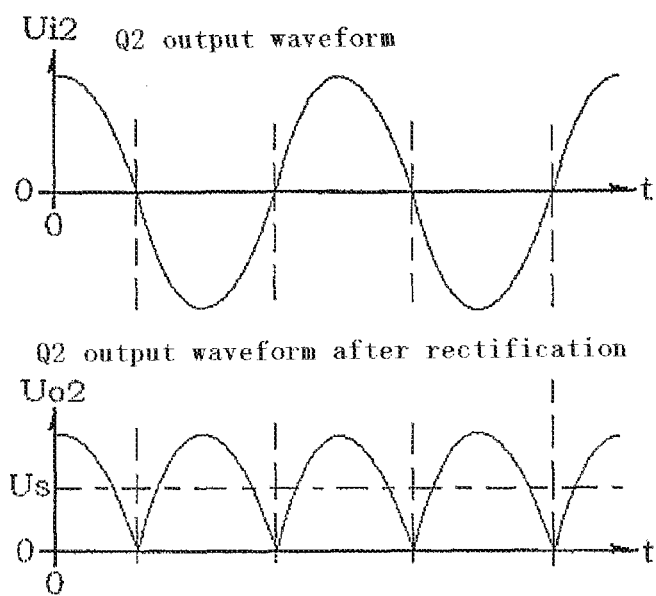
FIG. 3 is a schematic diagram illustrating the output waveform of the energy-obtaining coil Q2 and the output waveform after rectification.
Figure 4:
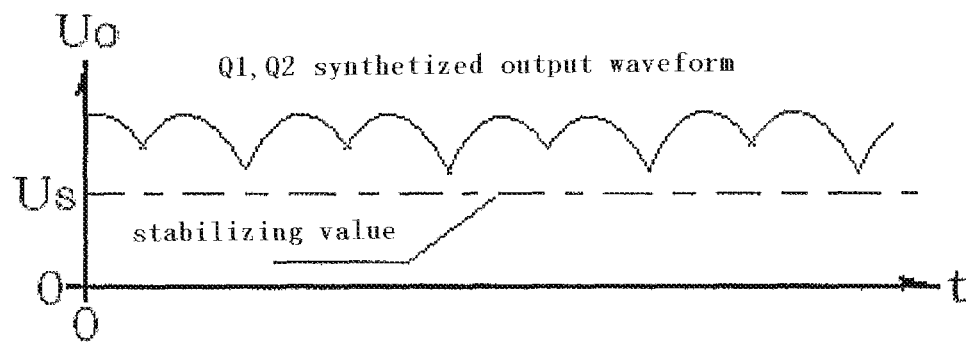
FIG. 4 is a schematic diagram illustrating the synthesized output waveform of the first energy-obtaining branch and the second energy-obtaining branch.

In the energy-obtaining coil 1, the energy-obtaining coils Q1 and Q2 are respectively used for obtaining energy from the alternating magnetic field of a power line; the bridge rectification circuits D3-6 respectively rectify, synthesize and output the energy obtained by the energy-obtaining coils Q1 and Q2 from the alternating magnetic field of the power line; the diodes D1 and D2 connected to the capacitor C1 in parallel are used for bypassing overvoltage; the capacitor C1 set in the first energy-obtaining branch is used for forward phase shift; so that, the first energy-obtaining branch forms the split-phase rectification output while the second energy obtaining branch adopts the non invert rectification output. As shown in FIG. 2 and FIG. 3, the phase of output waveform of the first energy-obtaining branch is 90° in advance to the phase of the output waveform of the second energy-obtaining branch. Therefore, it is possible to synthesize the two output waveforms of the first energy-obtaining branch and the second energy-obtaining branch fill the wave trough of each other, so as to reduce the pulse of direct current (referring to FIG. 4). In this way, the trough voltage of the synthesized wave is higher than the required stabilizing value Us of direct voltage, and it directly meets the input requirement of the stabilizing module M1, so as to avoid the delay caused by a big capacitance filtering (the details are described as follows).

The voltage-stabilizing circuit 2 includes a non-linear filtering and energy storing unit a (hereinafter referred to as unit a), a non-linear filtering and energy storing unit b (hereinafter referred to as unit b), a stabilizing module M1, a capacitor C4 and a capacitor C5, all of which are arranged in parallel. The unit a includes a resistor R1, a voltage-stabilizing diode W1, a resistor R2, a triode T1, a triode T2, a diode D11 and a capacitor C2; one end of the resistor R1 is connected to the input end of the voltage-stabilizing circuit 2, and the other end is connected to the cathode of the voltage-stabilizing diode W1; the anode of the voltage-stabilizing diode W1 is connected to the resistor R2; the other end of the resistor R2 is earthed; the triode T1 and the triode T2 form a Darlington switch; the base of the triode T1 is connected to the node of the voltage-stabilizing diode W1 and the resistor R2; the collectors of the triode T1 and of the triode T2 are connected to one end of the capacitor C2; the other end of the capacitor C2 is connected to the input end of the voltage-stabilizing circuit 2; the anode of the diode D11 is connected to the emitter of the triode T2, and the cathode is connected to the collector of the triode T2. The unit b includes a resistor R3, a voltage-stabilizing diode W2, a resistor R4, a triode T3, a triode T4, a diode D12 and a capacitor C3; one end of the resistor R3 is connected to the input end of the voltage-stabilizing circuit 2, and the other end is connected to the cathode of the voltage-stabilizing diode W2; the anode of the voltage-stabilizing diode W2 is connected to the resistor R4; the other end of the resistor R4 is earthed; the triode T3 and the triode T4 form a Darlington switch; the base of the triode T3 is connected to the node of the voltage-stabilizing diode W2 and the resistor R4; the collectors of the triode T3 and of the triode T4 are connected to one end of the capacitor C3; the other end of the capacitor C3 is connected to the input end of the voltage-stabilizing circuit 2; the anode of the diode D12 is connected to the emitter of the triode T4, and the cathode is connected to the collector of the triode T4. The input end of the stabilizing module M1 is connected to the input end of the voltage-stabilizing circuit 2, and the output end is connected to the control end of the A/D converting circuit 3; the output end of the stabilizing module M1 is earthed respectively via a capacitor C4 and a capacitor C5.

In this embodiment, a voltage-stabilizing diode of 3.8V is selected for the voltage-stabilizing diode W1, and a voltage-stabilizing diode of 5.2V is selected for the voltage-stabilizing diode W2. A low dropout voltage stabilizing module is selected for the stabilizing module M1, such as those with an input voltage of 5-40V, and an output voltage of 5V. The C2 is 47 uF, the C3 is 0.47 F, the C4 is 10 uF, and the C5 is 0.1 uf. The triodes T1, T2, T3 and T4 adopt C8050 triodes. The resistance R1=R3=10 k, and the resistance R2=R4=5 k.

The unit a and the unit b form a stepped type filtering and energy storing circuit (the unit a is the first order and the unit b is the second order); the working principle of the voltage-stabilizing circuit 2 is as follows: when Vin<K2 (the threshold K1=5.2V in this embodiment), the Darlington switches in the unit a and in the unit b are all cut off; C2 and C3 are both not charging, and the Vin is only supplied to the stabilizing output of the stabilizing module M1, Vo=5V; when Vin>5.2V, the triodes T1, T2 of the unit a are turned on, and C2 begins charging and participates in a small amplitude filtering. When Vin>K2 (the threshold K2=6.6V in this embodiment), the triodes T3, T4 of the unit b are turned on; C3 begins charging and storing energy. The discharge process of each of C2 and C3 is unrestricted because D11 and D12 have already formed a discharge circuit. From the foregoing, the unit a and the unit b both do not absorb energy in case where Vin is less than 5.2V, therefore the stabilizing module M1 is ensured to have the priority for obtaining the power input when Vin<5.2V. The unit b plays a role to perform large-capacity energy storage when the output voltage of the energy-obtaining coil is relatively high; as a result, the transformer may work for more than 30 additional seconds by relying on the power storage after an interruption of power supply. The capacitor C4 and the capacitor C5 are only used for small amplitude filtering of the output.

Still referring to FIG. 1, the A/D converting circuit 3, including a current sensor M2 and an A/D converting module M3, is used for converting the current value on the primary wire into digital signals continuously; the control end thereof is connected to the output end of the stabilizing module M1.

A Rogowski coil or LPCT (low-power current transformers) may be selected for the current sensor M2; the outputs of S1 and S2 are 0-2.5 Vac voltage; the A/D converting module M3 is composed of 16-bit A/D chips and microprocessor chips, the A/D converting and the communication programming of which are conducted according to the protocols stipulated in the standard of "IEC60044-8-2002".

The startup and operation procedure of the whole electronic current trans-former based on complete self-excitation power supply is that, after each switching on, the energy-obtaining coil 1 obtains magnetic field energy from the current once; the voltage-stabilizing circuit 2 rapidly stabilizes and outputs the voltage; the A/D converting circuit 3 immediately starts up after obtaining the power, performs the A/D converting of the current value continuously under the control of a microprocessor, and outputs the digital signals directly from a Do port or outputs the optical digital signals subsequently via the E/O converting.

The electronic current transformer based on complete self-excitation power supply provided in the above embodiments obtains energy by use of double coils, which has solved the problem of delay caused by using a single coil to obtain energy. Specifically, the rectified output of the single coil has a pulse waveform, thus the trough voltage is lower than the minimum stabilizing value required by the operating circuit (referring to FIG. 2 and FIG. 3); in general, the stabilizing output must be obtained via the method of capacitance filtering; the capacitance filtering may generate a relative large delay of output waveform, which results in the prolonging of the wake up time of the transformer. In the above embodiments, however, the energy-obtaining coil Q1 is connected to the capacitor C1 in series, so as to make the output phase to be shifted forward (i.e. to generate the split-phase); in this way, the two direct current outputs of the energy-obtaining coil Q1 and the energy-obtaining coil Q2 fill the wave trough of each other, and the pulse of Vin is reduced (referring to FIG. 4); the trough voltage has been higher than the required direct current stabilizing value Us, and the stabilizing voltage Us=5V may be rapidly output after being stabilized by the stabilizing module M1 of the voltage-stabilizing circuit 2; as a result, the A/D converting circuit 3 rapidly starts up; the application of this measure can shorten the wake up time of the trans-former from 50-100 mS to 2-5 mS, and can meet the requirement of relay protection of the power grid.

The foregoing are only preferred embodiments of the present invention for sufficient disclosure but not for limiting the protection scope thereof. It should be noted that, the key concept of the present invention is that, by forming phase difference from each other between the two energy-obtaining branches, the two output waveforms are synthesized to fill the wave trough of each other, and the pulse of direct current is reduced. In this way, the trough voltage of the synthesized waves is higher than the required stabilizing value of direct voltage and directly meets the input requirement of the stabilizing module of the voltage-stabilizing circuit. As a result, it is possible to activate the A/D converting circuit rapidly. Therefore, the phase difference is not limited to that the first energy-obtaining branch leads the second energy-obtaining branch by 90°, which may be within a certain range; It is tested and verified that the phase differences of 60-90° can produce significant effects. In addition, for those skilled in the art, on the premise of implementing the same function, the nonlinear filtering and energy storing unit a and the nonlinear filtering and energy storing unit b may be completely implemented by use of other structures, and the threshold K1 and K2 of which may be varied according to different uses.

The invention claimed is:

1. An electronic current transformer based on complete self-excitation power supply, comprising: an energy-obtaining coil, a rapid voltage-stabilizing circuit and an A/D converting circuit; the output of energy-obtaining coil is connected with the input of the voltage-stabilizing circuit; the output of voltage-stabilizing circuit is served as the working power supply of the A/D converting circuit; wherein, the energy-obtaining coil is composed of two energy-obtaining branches, the phase of waveshapes output of one energy-obtaining branch leads the phase of waveshapes output of the other energy-obtaining branch by 60-90°; the two waveshapes outputs of the two energy-obtaining branches are synthesized as input for the voltage-stabilizing circuit.

2. The electronic current transformer based on complete self-excitation power supply of claim 1, wherein the first energy-obtaining branch includes an energy-obtaining coil Q1, a diode D1, a diode D2, a capacitor C1, bridge rectification circuits D3-6; the energy-obtaining coil Q1 obtains energy from a power line alternating magnetic field; the bridge rectification circuits D3-6 rectify and output the energy obtained by the energy-obtaining coil Q1 from the power line alternating magnetic field; the capacitor C1 is connected to the secondary circuit of the energy-obtaining coil Q1 in series; the diode D1 and the diode D2 are set in reverse to each other, and are connected to the capacitor C1 in parallel.

3. The electronic current transformer based on complete self-excitation power supply of claim 2, wherein the first energy-obtaining branch further comprises a choke coil L1, which is concatenated before the output end of the energy-obtaining coil Q1 and the bridge rectification circuits D3-6.

4. The electronic current transformer based on complete self-excitation power supply of claim 2, wherein the second energy-obtaining branch includes an energy-obtaining coil Q2, bridge rectification circuits D7-10, the energy-obtaining coil Q2 obtains energy from a power line alternating magnetic field; the bridge rectification circuits D7-10 rectify and output the energy obtained by the energy-obtaining coil Q2 from the power line alternating magnetic field.

5. The electronic current transformer based on complete self-excitation power supply of claim 4, wherein the second energy-obtaining branch further comprises a choke coil L2, which is concatenated before the output end of the energy-obtaining coil Q2 and the bridge rectification circuits D7-10.

6. The electronic current transformer based on complete self-excitation power supply of claim 1, wherein the voltage-stabilizing circuit includes a parallel arranged stabilizing module M1, a first order nonlinear filtering storage unit and a second order nonlinear filtering storage unit; when the input voltage of the voltage-stabilizing circuit is less than a threshold K1, the first order nonlinear filtering storage unit and the second order nonlinear filtering storage unit are both not charged; the input of the voltage-stabilizing circuit is only supplied to the stabilizing output of the stabilizing module M1; when the input voltage of the voltage-stabilizing circuit is greater than the threshold K1, the first order nonlinear filtering storage unit begins charging and participates in a small amplitude filtering; when the input voltage of the voltage-stabilizing circuit is greater than a threshold K2, K2>K1, the second order nonlinear filtering storage unit begins charging.

7. The electronic current transformer based on complete self-excitation power supply of claim 6, wherein the first order nonlinear filtering storage unit includes a resistance R1, a voltage-stabilizing diode W1, a resistance R2, a triode T1, a triode T2, a diode D11 and a capacitor C2; one end of the resistance R1 is connected to the input end of the voltage-stabilizing circuit, and the other end is connected to the cathode of the voltage-stabilizing diode W1; the anode of the voltage-stabilizing diode W1 is connected to one end of the resistance R2; the other end of the resistance R2 is earthed; the triode T1 and the triode T2 form a Darlington switch; the base of the triode T1 is connected to the node of the voltage-stabilizing diode W1 and the resistance R2; the collectors of the triode T1 and the triode T2 are connected to one end of the capacitor C2; the other end of the capacitor C2 is connected to the input end of the voltage-stabilizing circuit; the anode of the diode D11 is connected to the emitter of the triode T2, and the cathode is connected to the collector of the triode T2.

8. The electronic current transformer based on complete self-excitation power supply of claim 6, wherein the second order nonlinear filtering storage unit includes a resistance R3, a voltage-stabilizing diode W2, a resistance R4, a triode T3, a triode T4, a diode D12 and a capacitor R3; one end of the resistance R3 is connected to the input end of the voltage-stabilizing circuit 2, and the other end is connected to the cathode of the voltage-stabilizing diode W2; the anode of the voltage-stabilizing diode W2 is connected to one end of the resistance R4; the other end of the resistance R4 is earthed; the triode T3 and the triode T4 form a Darlington switch; the base of the triode T3 is connected to the node of the voltage-stabilizing diode W2 and the resistance R4; the collectors of the triode T3 and the triode T4 are connected to one end of the capacitor C3; the other end of the capacitor C3 is connected to the input end of the voltage-stabilizing circuit 2; the anode of the diode D12 is connected to the emitter of the triode T4, and the cathode is connected to the collector of the triode T4.

9. The electronic current transformer based on complete self-excitation power supply of claim 6, wherein the input end of the stabilizing module M1 is connected to the input end of the voltage-stabilizing circuit, and the output end is connected to the control end of the A/D converting circuit 3; the output ends of the stabilizing module M1 are earthed respectively via a capacitor C4 and a capacitor C5.

* * * * *